United States Patent
Shih et al.

(10) Patent No.: US 10,153,412 B2
(45) Date of Patent: Dec. 11, 2018

(54) PACKAGE STRUCTURE FOR ULTRAVIOLET LIGHT-EMITTING DIODE

(71) Applicant: INSTITUTE OF NUCLEAR ENERGY RESEARCH, ATOMIC ENERGY COUNCIL, EXECUTIVE YUAN, R.O.C., Taoyuan County (TW)

(72) Inventors: Zun-Hao Shih, Taoyuan County (TW); Kai-Hsiang Yang, Taoyuan County (TW); Jia-Ruei Chang, Taoyuan Couunty (TW); Hwen-Fen Hong, Taoyuan County (TW)

(73) Assignee: Institute of Nuclear Energy Research, Atomic Energy Council, Executive Yuan, R.O.C., Taoyuan (TW)

( * ) Notice: Subject to any disclaimer, the term of this patent is extended or adjusted under 35 U.S.C. 154(b) by 0 days.

(21) Appl. No.: 15/234,176

(22) Filed: Aug. 11, 2016

(65) Prior Publication Data

US 2018/0047881 A1  Feb. 15, 2018

(51) Int. Cl.
*H01L 33/60* (2010.01)
*H01L 33/48* (2010.01)
*H01L 33/62* (2010.01)

(52) U.S. Cl.
CPC ............ *H01L 33/60* (2013.01); *H01L 33/486* (2013.01); *H01L 33/62* (2013.01); *H01L 2224/48091* (2013.01); *H01L 2224/48227* (2013.01)

(58) Field of Classification Search
CPC ..... H01L 2224/48091; H01L 2924/181; H01L 33/60
See application file for complete search history.

(56) References Cited

U.S. PATENT DOCUMENTS

| | | | |
|---|---|---|---|
| 2009/0015138 A1* | 1/2009 | Daicho | C09K 11/7734 313/503 |
| 2009/0267484 A1* | 10/2009 | Kasakura | C09K 11/0883 313/502 |
| 2010/0123156 A1* | 5/2010 | Seo | H01L 33/54 257/99 |
| 2013/0070441 A1* | 3/2013 | Moon | H01L 33/483 362/84 |
| 2014/0231850 A1* | 8/2014 | Tischler | H01L 33/508 257/98 |
| 2014/0367718 A1* | 12/2014 | Park | H01L 33/486 257/98 |
| 2016/0005931 A1* | 1/2016 | Lee | H01L 33/486 257/98 |
| 2016/0260877 A1* | 9/2016 | Chen | H01L 33/62 |
| 2017/0084799 A1* | 3/2017 | Ouderkirk | H01L 25/0753 |

* cited by examiner

*Primary Examiner* — Julia Slutsker
(74) *Attorney, Agent, or Firm* — Rosenberg, Klein & Lee

(57) ABSTRACT

The present embodiment discloses a package structure for ultraviolet LED, which comprises a substrate, an ultraviolet light-emitting diode (LED), and an optical device. The wavelength of the light emitted by the ultraviolet LED is between 200 and 400 nm. The optical device includes amorphous silicon dioxide, and thus enabling the transmittivity of ultraviolet light greater than 80%. In addition, by including a reflective ring and a metal film, the material aging problem of the sealing material can be prevented by blocking direct ultraviolet-light illumination. The package structure according to the present invention overcomes the limitation on planar packaging, so that the applications of backend processes can be extended.

18 Claims, 3 Drawing Sheets

PACKAGE STRUCTURE FOR ULTRAVIOLET LIGHT-EMITTING DIODE

FIELD OF THE INVENTION

The present invention relates generally to a package structure, and particularly to a package structure for ultraviolet light-emitting diode (LED).

BACKGROUND OF THE INVENTION

LEDs are light-emitting devices using semiconductors as the light-emitting material. The principle of emitting light is to apply an external voltage to enable electrons and holes in semiconductors to recombine and thus emitting photons. Since no filament is required, LEDs own the features of mercury free, saving power, low power consumption, small size, long lifetime, fast response, and high light-emitting efficiency and avoid the drawbacks of huge heat generation and burnout. Accordingly, LEDs are called the fourth-generation light source or the green light source.

The wavelength of the light emitted by an LED is determined by the energy level of the fabrication material and can cover the wavelength range from the ultraviolet light, visible light, to the infrared. Infrared LEDs can be applied in night monitor and optical fiber communication. Visible-light LEDs include multiple colors, and are applied extensively in general lighting, indicators, backlights, and plant lighting. Ultraviolet LEDs can be further classified into three segments of wavelength: UVA, UVB, and UVC. The wavelength of the UVA light is between 320 and 400 nm and the UVA light is also called near ultraviolet light. It can be applied in identification of counterfeit money, ultraviolet light therapy, and air purification. The wavelength of the UVB light is between 280 and 320 nm and the UVB light is applied in biotech industries and medical health protection. The ultraviolet light having wavelengths less than 280 nm is the UVC, also called the deep ultraviolet light. The UVC has the strongest energy among the three types, capable of penetrating the cell membrane and the cell nucleus of microorganisms and destroying the molecular bonds of nucleic acid. It is mainly applied in water or air sterilization systems. Currently, the applications and technologies of UVA and UVB have been mature. The related industries and research institutions keep developing the applications of UVC and breaking through the limitations of current technologies.

The current packaging technologies for ultraviolet LED are mainly the transistor outline can (TO-can) architecture. It owns excellent airtightness, and hence reducing the influence of the external environment on ultraviolet LED dies. In addition, the TO-can packaging technology is performed using inorganic materials. The aging problem caused by long-term illumination of ultraviolet light will not occur, leading to superior reliability. Nonetheless, owing to the existence of pins in TO-can metal packages, the heat dissipating capability is limited and the leads become the bottleneck for thermal conduction efficiency. Consequently, the TO-can technology is limited to low-power ultraviolet LEDs. In addition, the TO-can is a nonplanar packaging architecture, which imposes more spatial limitations on process backend modules and system integration.

The surface-mount device (SMD) packaging technology is a packaging technology for visible LEDs according to the prior art. It owns the advantages of small size, large angles of dispersion, and uniform light emission. The spatial limitation problem can be solved by replacing the TO-can packaging technology with the SMD packaging method. Nonetheless, the SMD technology adopts organic high-polymers, such as silica gels, acrylics, or epoxy resins, for packaging. Under the illumination of ultraviolet light, the chemical bonds of the high-polymers will be destroyed. The ultraviolet packages adopting organic high-polymers as the sealing material according to the prior art all face the problems of insufficient reliability and material aging. In order to overcome the drawbacks in the technologies according to the prior art, the present invention improves the SMD package structure according to the prior art. In addition to keeping the advantages of the SMD structure according to the prior art, aging of the packaging materials can be prevented. Besides, the limitation of planar packages according to the prior art can be conquered as well.

SUMMARY

An objective of the present invention is to provide a package structure for ultraviolet LED. The wavelength of the light emitted by an ultraviolet LED ranges between 200 and 400 nm. An optical device of the package structure includes silicon dioxide. The transmittivity of the optical device for ultraviolet light is greater than 80%. Compared with the ultraviolet LED according to the prior art, the package structure according to the present invention has superior light-emitting efficiency and transmittivity.

Another objective of the present invention is to provide a package structure for ultraviolet LED. A metal film is disposed at the bottom of an optical device of the package structure for blocking ultraviolet light form illuminating the sealing material and thus preventing material aging. In addition, the metal film can increase light emission of the ultraviolet LED.

A further objective of the present invention is to provide a package structure for ultraviolet LED. A reflective ring is disposed on a substrate of the package structure and between the ultraviolet LED and the optical device for blocking lateral illumination of ultraviolet light and thus preventing material aging. The reflective ring can also be used as the alignment mark for assembling the optical device and the substrate.

In order to achieve the above objectives, the present invention discloses a package structure for ultraviolet LED, which comprises a substrate, an ultraviolet LED, and an optical device. The ultraviolet LED is disposed on the substrate. The optical device includes silicon dioxide and a recess. The recess faces and hoods the substrate. A sealing material is then used for attaching the substrate and the bottom of the optical device, so that the ultraviolet LED is located between the substrate and the optical device.

Furthermore, a metal film is disposed at the bottom of the optical device. A reflective ring is disposed on the substrate and between the ultraviolet LED and the optical device.

According to an embodiment of the present invention, an accommodating space is included between the substrate and the optical device.

According to an embodiment of the present invention, the silicon dioxide is amorphous.

According to an embodiment of the present invention, the junction between the bottom and a side surface of the optical device is a non-perpendicular junction.

According to an embodiment of the present invention, the height of the sealing material is less than the height of the reflective ring.

According to an embodiment of the present invention, the sealing material includes a gel.

According to an embodiment of the present invention, the metal film includes aluminum.

DETAILED DESCRIPTION

In order to make the structure and characteristics as well as the effectiveness of the present invention to be further understood and recognized, the detailed description of the present invention is provided as follows along with embodiments and accompanying figures.

The present embodiment provides a package structure for ultraviolet LED, which comprises an optical device. The optical device includes amorphous silicon dioxide. The ultraviolet light with a wavelength between 200 and 400 nm is able to penetrate the optical device, ensuring superior transmittivity and a broader wavelength range for ultraviolet-light penetration. In addition, by including a reflective ring and a metal film, the aging problem on the sealing material caused by ultraviolet-light illumination can be solved and the light-emitting efficiency of the ultraviolet LED can be enhanced. Accordingly, the limitations on planar packaging ultraviolet LEDs can be overcome.

Figure 1A:
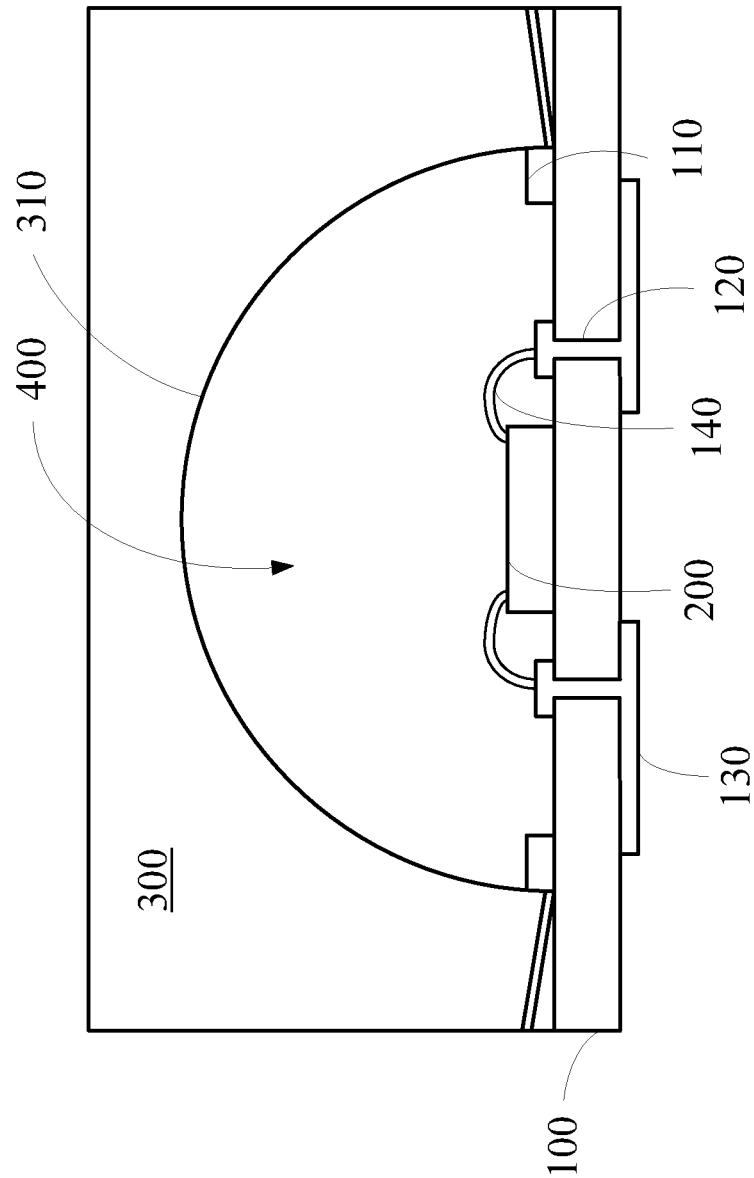
FIG. 1A shows a structural schematic diagram of the package structure according to the present invention.
Figure 1B:
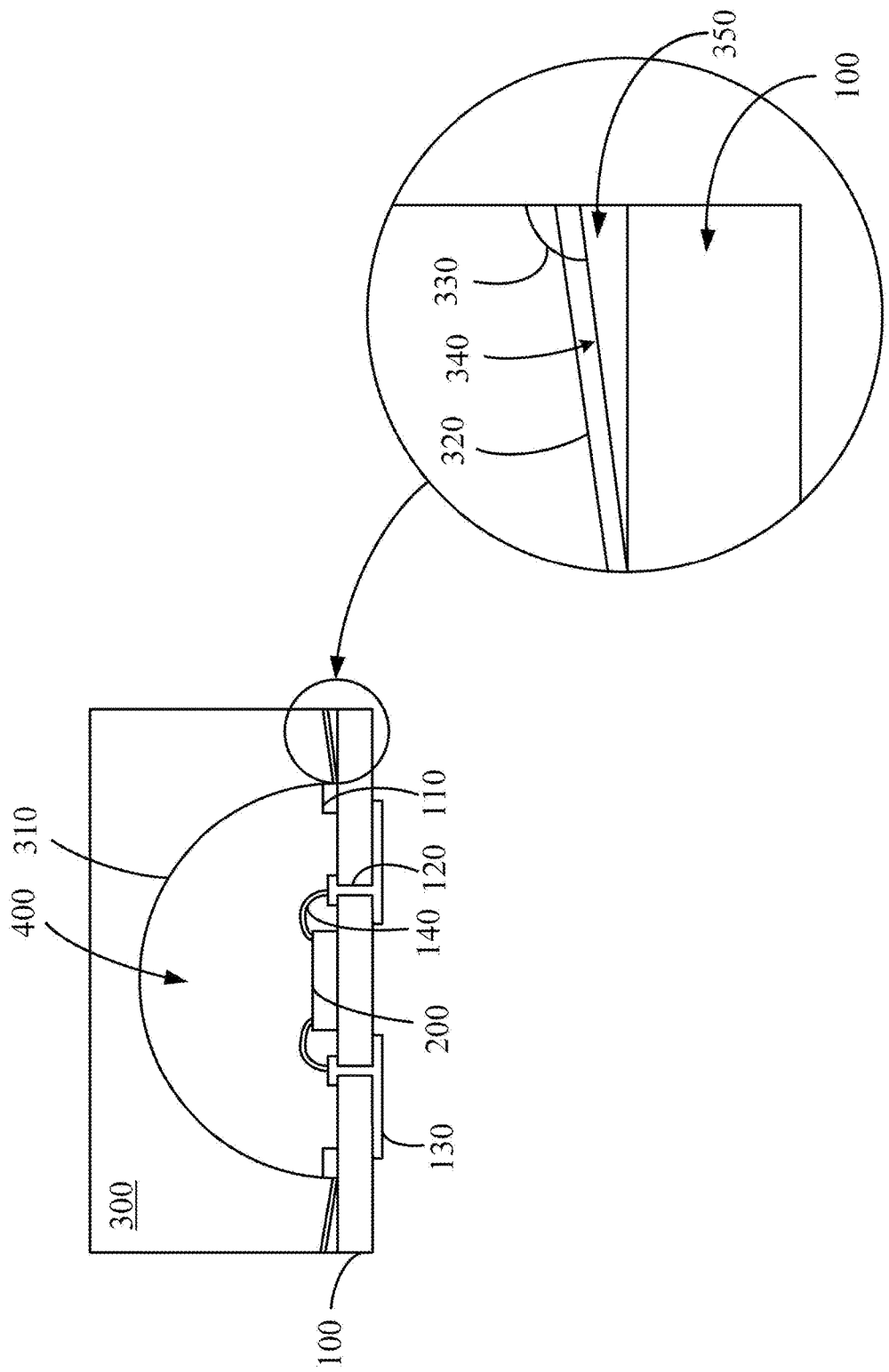
FIG. 1B shows a structural schematic diagram of the bottom of the optical device according to the present invention.

Please refer to FIGS. 1A and 1B, which show structural schematic diagrams of the package structure and the bottom of the optical device according to the present invention. As shown in the figures, the package structure according to the present invention comprises a substrate 100, an ultraviolet LED 200, and an optical device 300. The ultraviolet LED 200 is disposed on the substrate 100. The optical device 300 includes a recess 310, which faces and hoods the substrate 100, forming an accommodating space 400. Furthermore, a gel 350 is used for connecting the bottom of the optical device 320 and the substrate 100, so that the ultraviolet LED 200 is located between the substrate 100 and the optical device 300.

According to the above embodiment, the optical device 300 is high-purity amorphous silicon dioxide. The ultraviolet light with a wavelength between 200 and 400 nm is able to penetrate the optical device 300 with transmittivity over 80%. In addition, the optical device 300 overcomes the limitation on direct press-molding of quartz, and forming the structure of the recess 310 and the accommodating space 400. The optical device 300 can hood the substrate 100 directly for replacing fluorescent gel packaging and isolating the influence of the external environment on the ultraviolet LED 200. Besides, the recess 310 of the optical device 300 hoods the substrate 100 directly, which is distinct from the general SMD structure having a reflective hood. Thereby, the light-emitting angle of the ultraviolet LED 200 can be increased.

According to the present embodiment, a reflective ring 110 is further disposed on the substrate 100 and between the ultraviolet LED 200 and the optical device 300. In addition, a guiding hole 120 and a metal circuit board 130 are disposed on the substrate 100 and between the reflective ring 110 and the ultraviolet LED 200. Moreover, a gold wire 140 is used for connecting the ultraviolet LED 200 to the metal circuit board 130. A metal film 340 is disposed on the bottom of the optical device 320. The junction between the bottom of the optical device 320 and a side surface is a non-perpendicular junction 330.

Please refer to FIGS. 1A and 1B. Packaging an ultraviolet LED device includes three steps: die fixing, wire bonding, and packaging. First, the ultraviolet LED 200 is placed on the substrate 100 and connected to the metal circuit board 130 using the gold wire 140. Next, the optical device 300 is placed on the substrate 100. The reflective ring 110 disposed on the substrate 100 can be used as an alignment mark for placing the optical device 300. Then, the optical device 300 is pressed and uses the gel 350 for gluing, so that the bottom of the optical device 320 is attached tightly to the substrate 100. Because the junction between the bottom of the optical device 320 and a side surface is the non-perpendicular junction 330, during the attachment process, the gel 350 will not spill into the accommodating space 400 but be squeezed outwards. Besides, the reflective ring 110 disposed between the bottom of the optical device 320 and the ultraviolet LED 200 can prevent the gel 350 from spilling into the accommodating space 400 as well.

Figure 2:
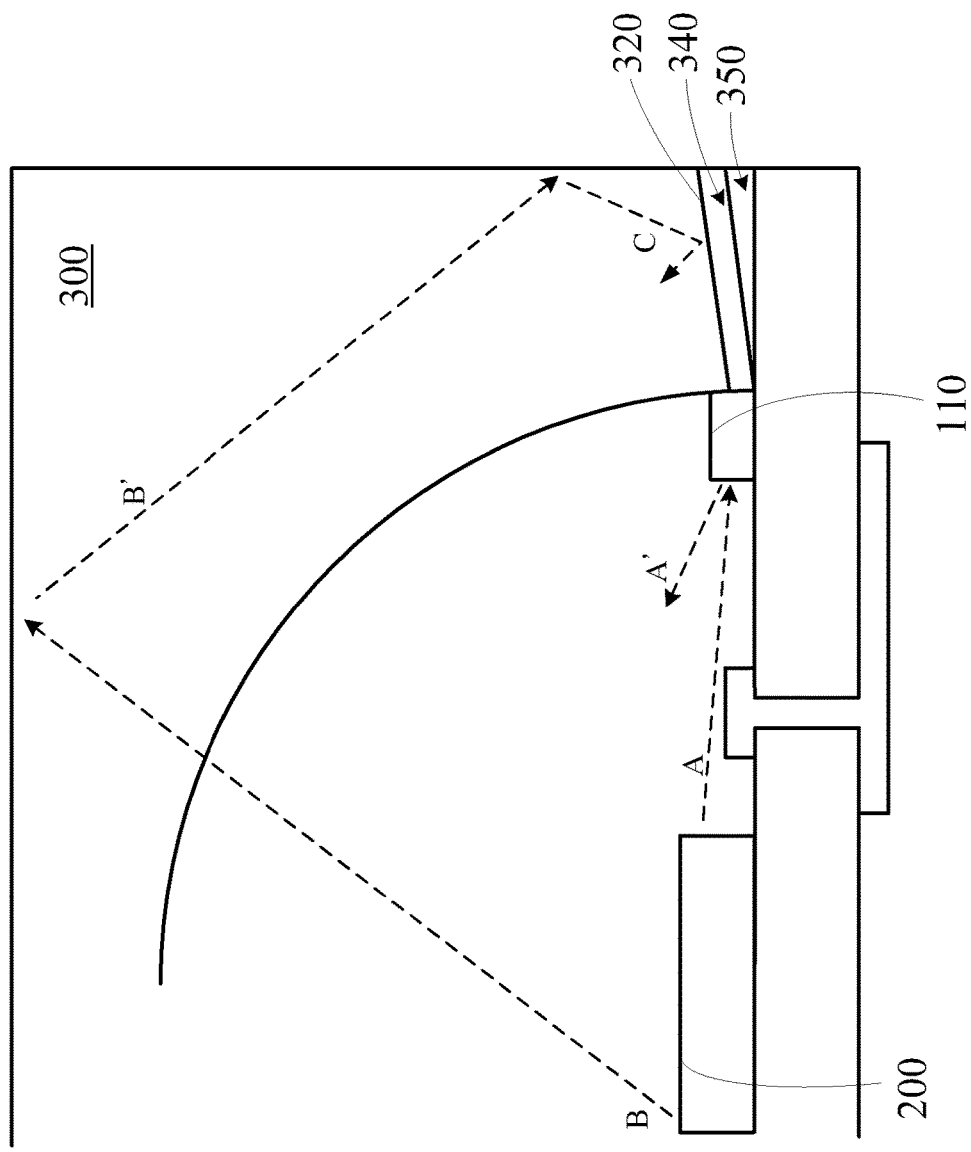
FIG. 2 shows the optical paths of the ultraviolet light of the package structure according to the present invention.

Please refer to FIG. 2, which shows the optical paths of the ultraviolet light of the package structure according to the present invention. As shown in the figure, the present invention ensures the reliability of the gel 350 in the package structure through the following methods. First, include the metal film 340 on the bottom of the optical device 320. The metal film 340 includes aluminum, which is the only thin-film material capable of reflecting short wavelengths. It has high reflectivity for ultraviolet light; it also adheres tightly to optical devices. The ultraviolet light B illuminates the optical device 300 and forms the reflection light B'. The reflection light B' then illuminates the metal film 340 and is reflected to form the reflection light C. Thereby, the gel 350 can be free from the illumination of ultraviolet light and thus avoiding aging. Meanwhile, the light emission of the ultraviolet LED can be increased as well. The other method is to include the reflective ring 110 between the ultraviolet LED 200 and the optical device 300. Because the height of the reflective ring 110 is greater than the height of the gel 350, as the ultraviolet light A illuminates the reflective ring 110, the reflection light A' will be formed, and hence blocking the ultraviolet light from illuminating laterally to the gel 350. Accordingly, prevention of material aging can be achieved.

To sum up, the package structure for ultraviolet LED according to the present invention adopts the amorphous silicon dioxide as the optical device, which can be penetrated by the ultraviolet light having wavelength between 200 and 400 nm with transmittivity above 80%. Thereby, the light-emitting performance of ultraviolet LEDs can be improved. In addition, the limitations on press-molding of quartz according to the prior art owing to the high melting point of quartz is overcome for disposing the recess structure, which increase the light-emitting angle of the ultraviolet LED as well as the light emission. Moreover, the package structure according to the present invention blocks ultraviolet light from illuminating the gel directly by using the metal film and the reflective ring. Hence, the purpose of protecting materials from aging can be achieved. This solves the problem of insufficient reliability in the sealing materials used in packaging ultraviolet LED devices planarly according to the prior art. The present invention overcomes the limitations on packaging ultraviolet LED devices planarly while keeping the advantages of planar packages. Thereby, it can replace the high-cost TO-scan package structure.

Consequently, the applications of backend processes for ultraviolet LEDs can be extended Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A package structure for an ultraviolet light-emitting diode, comprising:
    a substrate;
    an ultraviolet light-emitting diode emitting light with a minimum wavelength of 200 nanometers and disposed on said substrate;
    an optical device including a silicon dioxide material, the optical device formed with a recess covering said ultraviolet light-emitting diode and hooding said substrate, and the transmittivity of the ultraviolet light emitted by said ultraviolet light-emitting diode through said optical device being greater than 80%; and
    a metal film is disposed on a bottom surface of said optical device, said bottom surface of said optical device forming an obtuse angle between said bottom surface of said optical device and a side surface of said optical device defining a wedge shaped contour for containing a sealing material;
    wherein said ultraviolet light-emitting diode located between said substrate and said optical device.

2. The packaging structure of claim 1, and further comprising a reflective ring on said substrate and disposed between said ultraviolet light-emitting diode and said optical device.

3. The packaging structure of claim 1, and further comprising an accommodating space between said substrate and said optical device.

4. The packaging structure of claim 1, wherein said silicon dioxide is amorphous.

5. The packaging structure of claim 2, wherein said optical device is connected to said substrate using said sealing material.

6. The packaging structure of claim 5, wherein said sealing material includes a gel.

7. The packaging structure of claim 5, wherein a height of said sealing material is less than a height of said reflective ring.

8. The packaging structure of claim 1, wherein said metal film includes aluminum.

9. A package structure for an ultraviolet light-emitting diode, comprising:
    a substrate;
    an ultraviolet light-emitting diode disposed on said substrate; and
    an optical device including a recess covering said ultraviolet light-emitting diode and hooding said substrate, and the transmittivity of the ultraviolet light emitted by said ultraviolet light-emitting diode through said optical device being greater than 80%, and a metal film on a bottom surface of said optical device connected to said substrate using a sealing material, said bottom surface of said optical device forming an obtuse angle between said bottom surface of said optical device and a side surface of said optical device defining a wedge shaped contour for containing a sealing material.

10. The packaging structure of claim 9, and further comprising a reflective ring on said substrate and disposed between said ultraviolet light-emitting diode and said optical device.

11. The packaging structure of claim 9, and further comprising an accommodating space between said substrate and said optical device.

12. The packaging structure of claim 9, wherein said optical device includes silicon dioxide.

13. The packaging structure of claim 12, wherein said silicon dioxide is amorphous.

14. The packaging structure of claim 9, wherein said ultraviolet light-emitting diode emits light with a wavelength ranging between 200 and 400 nanometers.

15. The packaging structure of claim 9, wherein the transmittivity of the ultraviolet light emitted by said ultraviolet light-emitting diode through said optical device is greater than 80%.

16. The packaging structure of claim 10, wherein a height of said sealing material is less than a height of said reflective ring.

17. The packaging structure of claim 9, wherein said sealing material includes a gel.

18. The packaging structure of claim 9, wherein said metal film includes aluminum.

* * * * *